United States Patent
Liu

(10) Patent No.: US 9,012,289 B2
(45) Date of Patent: Apr. 21, 2015

(54) SEMICONDUCTOR DEVICE AND MANUFACTURING METHOD THEREOF

(71) Applicant: Jinhua Liu, Beijing (CN)

(72) Inventor: Jinhua Liu, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 14/017,163

(22) Filed: Sep. 3, 2013

(65) Prior Publication Data

US 2014/0004675 A1 Jan. 2, 2014

Related U.S. Application Data

(62) Division of application No. 13/305,537, filed on Nov. 28, 2011, now abandoned.

(30) Foreign Application Priority Data

Jun. 9, 2011 (CN) .......................... 2011 1 0152931

(51) Int. Cl.
*H01L 29/66* (2006.01)
*H01L 21/336* (2006.01)
(Continued)

(52) U.S. Cl.
CPC .... *H01L 29/66689* (2013.01); *H01L 29/42368* (2013.01); *H01L 29/66553* (2013.01); *H01L29/66659* (2013.01); *H01L 29/7816* (2013.01); *H01L 29/7835* (2013.01); *H01L 29/512* (2013.01); *H01L 29/513* (2013.01)

(58) Field of Classification Search
CPC .................. H01L 29/66689; H01L 29/42368; H01L 29/7835; H01L 29/66553; H01L 29/66659; H01L 29/7816; H01L 29/512; H01L 29/513; H01L 21/31; H01L 21/0475; H01L 21/302; H01L 21/3213; H01L 21/30604
USPC ......... 438/287, 283, 299, 304, 183, 197, 330, 438/300, 589, 591, 592, 596, 270; 257/336, 257/220, 288, 327, E29.256, E29.269, 257/E21.409, E21.419, E21.626, E21.2
See application file for complete search history.

(56) References Cited

U.S. PATENT DOCUMENTS 8,716,095 B2 * 5/2014 Zhong et al. .................. 438/304
2002/0197810 A1 * 12/2002 Hanafi et al. .................. 438/330
(Continued)

FOREIGN PATENT DOCUMENTS

| CN | 1494742 | 5/2004 |
|---|---|---|
| KR | 100299679 | 6/2001 |
| KR | 20030017751 | 3/2004 |

OTHER PUBLICATIONS

First Office Action from corresponding Chinese Appl. No. 201110152931.X, dated Jul. 11, 2014.
(Continued)

*Primary Examiner* — Wensing Kuo
*Assistant Examiner* — Moazzam Hossain
(74) *Attorney, Agent, or Firm* — Koppel, Patrick, Heybl & Philpott; Michael J. Ram

(57) ABSTRACT

A semiconductor device and its manufacturing method are disclosed. The semiconductor device comprises a gate, and source and drain regions on opposite sides of the gate, wherein a portion of a gate dielectric layer located above the channel region is thinner than a portion of the gate dielectric layer located at the overlap region of the drain and the gate. The thicker first thickness portion may ensure that the device can endure a higher voltage at the drain to gate region, while the thinner second thickness portion may ensure excellent performance of the device.

9 Claims, 4 Drawing Sheets

(51) Int. Cl.
*H01L 29/423* (2006.01)
*H01L 29/78* (2006.01)
*H01L 29/51* (2006.01)

(56) References Cited

U.S. PATENT DOCUMENTS

2004/0046191 A1 3/2004 Mori
2008/0308867 A1* 12/2008 Cai et al. .................. 257/348
2010/0038705 A1* 2/2010 Doris et al. .................. 257/327
2010/0148258 A1* 6/2010 Cho .............................. 257/343
2011/0049618 A1* 3/2011 Lee et al. ..................... 257/330

OTHER PUBLICATIONS

Second Office Action from corresponding Chinese Patent Application No. 201111052931.X, dated: Jan. 12, 2015.

* cited by examiner

SEMICONDUCTOR DEVICE AND MANUFACTURING METHOD THEREOF

CROSS REFERENCE

This application claims priority to Chinese Patent Application No. 201110152931.X, filed on Jun. 09, 2011 and entitled "Semiconductor Device and Manufacturing Method Thereof," and is a divisional of U.S. application Ser. No. 13/305,537 filed Nov. 28, 2011 and entitled "Semiconductor Device and Manufacturing Method Thereof," which are incorporated herein in their entirety by reference.

BACKGROUND OF THE INVENTION

1. Field of the Invention

The present invention generally relates to semiconductor devices and manufacturing methods for the devices and particularly, to a Lateral Double Diffusion Metal Oxide Semiconductor (LDMOS) device.

2. Description of the Related Art

High-voltage LDMOSes are often utilized in high-votage power integrated circuits to meet requirements of high voltage withstanding, power controlling, and so on. LDMOSes are also commonly used in RF power circuits. As compared to normal transistors, LDMOSes have significant advantages in key characteristics, such as gain, linearity, switch performance, heat dissipation, and reduced stages. Presently, LDMOSes are widely used due to their good compatibility with CMOS processes.

FIG. 11 shows a schematic diagram of a LDMOS of the prior art. The LDMOS shown has a lightly doped N-type drift region 210(N−) on a substrate 200, and a deeply doped N-type drain region 280 (N+) located in the drift region 210. The LDNMOS has a p-well 220 on the substrate 200, and a deeply doped source region 290 disposed in the p-well 220. A gate dielectric layer 270 is located below a gate 300. As to the LDMOS device, the source 290-to-drain 280 region can endure a high voltage since the N-drift region 210 has a very high resistance. Thereby, as shown by the arrow 295 in FIG. 11, the drain 280 and gate 300 have an overlap region where the drain resistance is very small, the high voltage at the drain 280 is directly applied on the overlap region of the drain 280 and gate 300 without voltage dividing of a high resistance region, and consequently, gate oxide layer breaking down may occur in the drain-gate overlap region, which will cause device failure.

In existing LDMOS devices, it is possible to increase the thickness of the gate dielectric layer 270 to raise the breakdown voltage of the drain-gate overlap region. However, a thicker gate dielectric layer 270 may degrade the device performance.

SUMMARY OF THE INVENTION

According to a first aspect of this invention, a semiconductor device is provided, which may comprise:

A gate located on a substrate; a source region and a drain region located on opposite sides of the gate; a gate dielectric layer located between the substrate and the gate, the gate dielectric layer having a first thickness portion and a second thickness portion, wherein the first thickness portion is at least located between the drain region and the gate, the thickness of the first thickness portion is larger than the thickness of the second thickness portion.

Preferably, the first thickness portion is further located between the source region and the gate.

Preferably, the drain region extends in the direction from the drain region to the center of the gate but not beyond the first thickness portion of the gate dielectric layer.

Preferably, the source region extends in the direction from the source region to the center of the gate but not beyond the first thickness portion of the gate dielectric layer.

Preferably, the thickness of the first thickness portion of the gate dielectric layer is greater than or equal to 1 nanometer (nm) and less than or equal to 200 nm.

Preferably, the thickness of the second thickness portion of the gate dielectric layer is greater than or equal to 0.5 nm and less than or equal to 200 nm.

Preferably, the drain region of the semiconductor device has a first conductive type and is arranged in a lightly doped drift region of the first conductive type, and the source region has the first conductive type and is arranged in a well of a second conductive type.

According to a second aspect of this invention, a semiconductor apparatus is provided, which may comprise the semiconductor device according to the first aspect of this invention.

According a third aspect of this invention, a method of manufacturing semiconductor devices is provided, which may comprise the following steps: providing a substrate, forming a patterned dielectric layer on the substrate, the patterned dielectric layer having an opening to expose a portion of the upper surface of the semiconductor substrate; forming a first gate dielectric layer and a mask layer on the substrate; etching the mask layer to retain at least a portion of mask layer on the first gate dielectric layer within the opening; etching the first gate dielectric layer using the residual of the mask layer as a mask to expose a portion of the substrate within the opening; forming a second gate dielectric layer on the exposed substrate portion, wherein the thickness of the second gate dielectric layer is less than that of the first gate dielectric layer.

Preferably, the step of removing the mask layer may further comprise: removing the mask layer so that the residual of the mask layer is located within the opening and is attached to at least one sidewall of the opening.

Preferably, the step of forming a second gate dielectric layer within the opening can be further followed by: forming a gate on the substrate, forming a lightly doped drift region of a first conductive type and a well of a second conductive type on opposite sides of the gate, and forming a deeply doped drain region of the first conductive type in the drift region, and forming a source region in the second conductive type well.

Preferably, the step of removing the mask layer may further comprise: removing the mask layer through dry etching.

Preferably, the step of forming a second gate dielectric layer within the opening may comprise thermal growing of the second gate dielectric layer in the opening, the second gate dielectric layer has a range of thickness greater than or equal to 0.5 nm and less than 200 nm.

Preferably, forming the first gate dielectric layer and the mask layer within the opening may comprise depositing the first gate dielectric layer, the first gate dielectric layer has a range of thickness greater than or equal to 1 nm and less than or equal to 200 nm.

Preferably, the step of forming an opening on the substrate using the patterned dielectric layer may comprise: forming the dielectric layer on the substrate, which includes a nitride dielectric layer and an oxide dielectric layer and etching the dielectric layer to form the opening on the substrate to expose a portion of the substrate.

Preferably, the method may further comprise: depositing polycrystalline silicon to fill the opening; removing the polycrystalline silicon through chemical mechanical polishing to retain the polycrystalline silicon portion located within the opening so as to form the gate; removing the patterned dielectric layer; forming gate spacers on opposite sides of the gate and forming the source and drain regions on opposite sides of the gate.

BRIEF DESCRIPTION OF THE DRAWINGS

The present invention will be better understood when reading the following detailed description with reference to the drawings, and the same reference labels refer to the same elements, in which.

It will be appreciated that, for simplicity and clarity, elements are not necessarily illustrated in proportion in those drawings. For example, for facilitating and improving clarity and understanding, some elements are enlarged in size with respect to other elements. Further, in those drawings, replicated labels are used to denote corresponding or same elements.

DESCRIPTION OF THE EMBODIMENTS

The present invention provides a novel semiconductor device, which may comprise a gate located on a substrate, a source region and a drain region located on opposite sides of the gate; a gate dielectric layer arranged between the substrate and the gate, the gate dielectric layer having a first thickness portion and a second thickness portion, the first thickness portion of the gate dielectric layer disposed between the drain region and the gate and has a thickness larger than that of the second thickness portion.

The thickness of the first thickness portion can be selected according to design requirements, for example, according to the drain to gate break-down voltage, and the thickness of the second thickness portion of the gate dielectric layer can be selected to be less than the thickness of the first thickness portion.

The first thickness portion is thicker so that the drain to gate region of the semiconductor device can endure a higher voltage, while the thinner second thickness portion may ensure excellent device performance.

Embodiments of this invention are described by way of example with reference of drawings.

Figure 1:
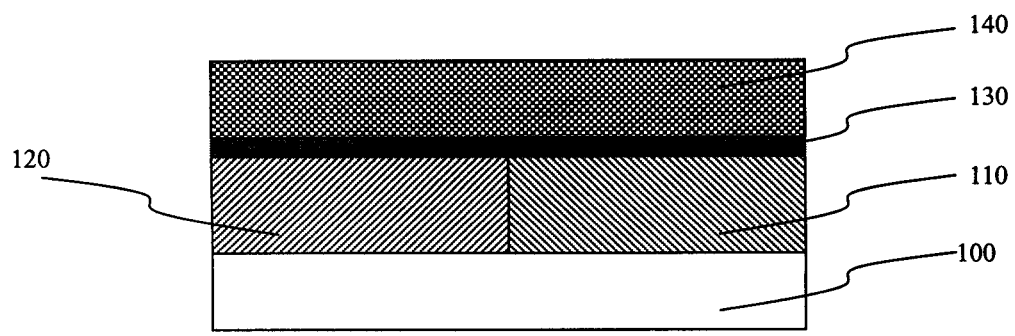
FIG. 1 is a cross section view of a semiconductor device at a first step of its manufacture according to one embodiment of the invention.
Figure 2:
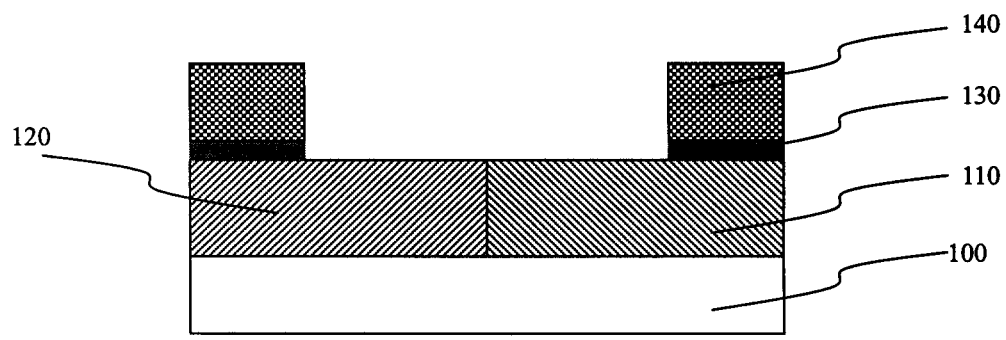
FIG. 2 is a cross section view of a semiconductor device at a second step of its manufacture according to one embodiment of the invention.

Referring to FIG. 1, a semiconductor substrate 100 is provided, which may be, for example, a Si substrate. An N-well 110 and a p-well 120 are arranged laterally and adjacently in the semiconductor substrate 100. An oxide dielectric layer 130 and a nitride dielectric layer 140 are deposited on the N-well 110 and p-well 120. In one embodiment, the oxide dielectric layer 130 may be made of $SiO_2$, and the nitride dielectric layer 140 can be made of SiN. Obviously, any other suitable oxides, nitrides and/or combinations thereof can be used by those skilled in the art to realize the oxide dielectric layer 130 and nitride dielectric layer 140 herein. Upon forming the structure as shown in FIG. 1, a photoresist is applied thereon, and the photoresist is patterned through photolithography with a photomask (not shown here), then the oxide dielectric layer 130 and nitride dielectric layer 140 are etched to form an opening, thereby at least a portion of the N-well 110 and at least a portion of the p-well 120 are exposed simultaneously, as shown in FIG. 2.

Figure 3:
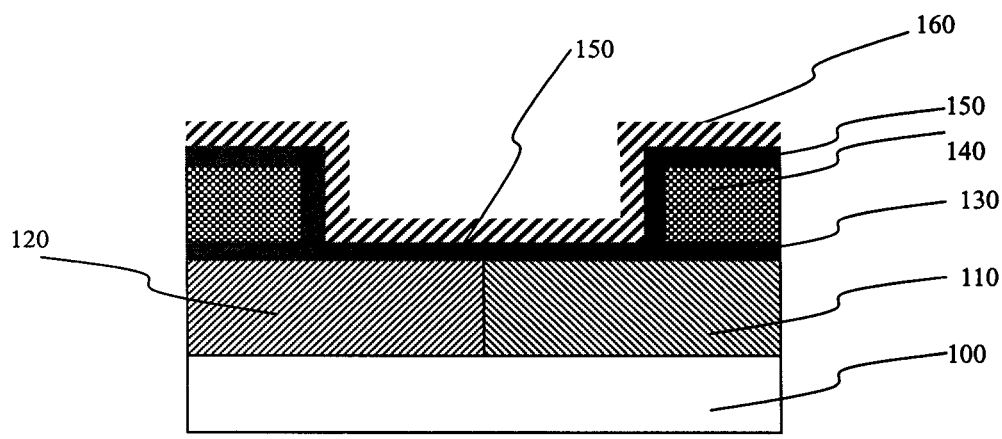
FIG. 3 is a cross section view of a semiconductor device at third step of its manufacture according to one embodiment of the invention.

In FIG. 3, a first gate dielectric layer 150 is deposited. Subsequently, a nitride dielectric layer 160 is deposited conformally. Note that, as discussed below, a part of the first gate dielectric layer 150 will be used as a part of the gate dielectric layer of the finished device, while a part of the nitride dielectric layer 160 will be used as a mask layer in etching. Therefore, in the deposition of the first gate dielectric layer 150, it should be deposited to an expected thickness. As discussed below, the thickness of the first gate dielectric layer 150 is related to the amplitude of the breakdown voltage so that the drain to gate region can endure. Appropriately selecting the thickness of the first gate dielectric layer 150 can result in a higher breakdown voltage. In one embodiment, the first gate dielectric layer 150 has a range of thickness larger than or equal to 1 nm and less than or equal to 200 nm. Certainly, the thickness of the first gate dielectric layer 150 can be selected by those skilled in the art depending on the expected performance and applications of the device.

Figure 4:
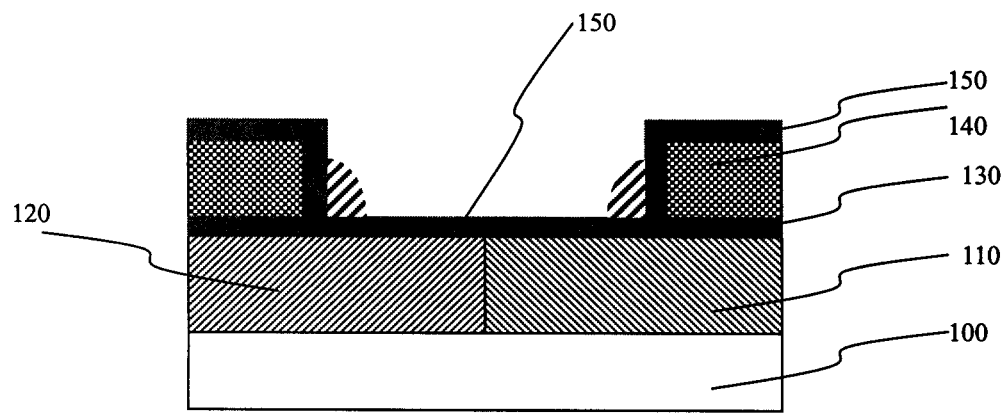
FIG. 4 is a cross section view of a semiconductor device at fourth step of its manufacture according to one embodiment of the invention.

In FIG. 4, the nitride dielectric layer 160 is etched so that at least a residual portion 180 of the nitride dielectric layer 160 remains at the sidewall of the opening, exposing at least a portion of the first gate dielectric layer 150. In one embodiment, the nitride dielectric layer 160 is removed through dry etching. Through appropriately selecting dry etching conditions, the portion 180 of the nitride dielectric layer 160 can be naturally retained on opposite sides of the opening due to the presence of the open sidewalls shown in FIG. 4. In other words, etching steps selected herein, such as anisotropic dry etching, intentionally retains at least a portion 180 of the nitride dielectric layer 160 at the sidewall. Certainly, various other suitable methods can also be used by those skilled in the art to achieve the same effect, such as photomask etching, grinding, etc. For conciseness, the retained portion 180 of the nitride dielectric layer 160 is referred to as residual 180 hereinafter. As will be clear with reference to the description below, the residual 180 will be used as an etching mask later.

Figure 5:
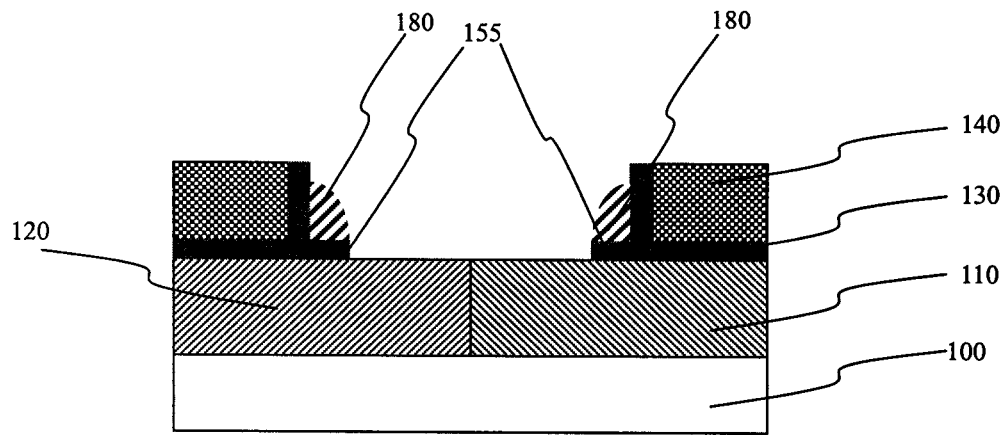
FIG. 5 is a cross section view of a semiconductor device at fifth step of its manufacture according to one embodiment of the invention.

In FIG. 5, a portion the first gate dielectric layer 150 is etched using the residual 180 as a mask. Due to the presence of the residual 180, the portion 155 of the first gate dielectric layer 150 which is located below the residual 180 is retained.

As discussed hereinafter, the residual 155 of the first gate dielectric layer 150 is used later as a part of the gate dielectric layer.

Figure 6:
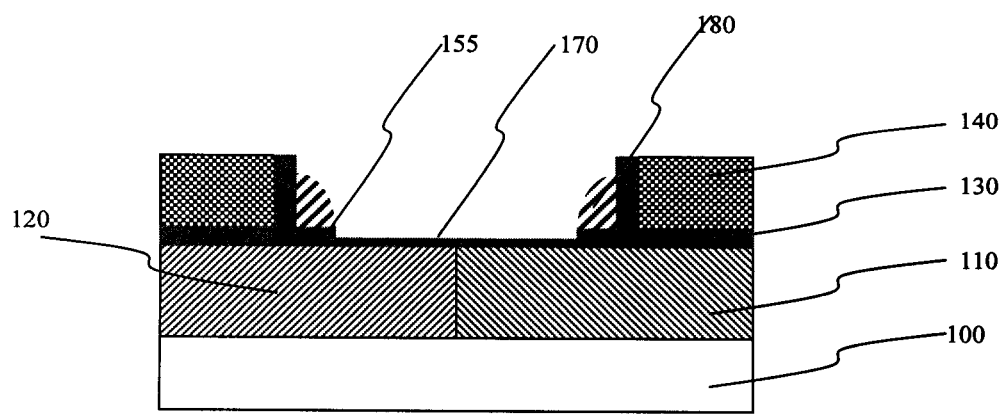
FIG. 6 is a cross section view of a semiconductor device at sixth step of its manufacture according to one embodiment of the invention.

Referring to FIG. 6, a second gate dielectric layer 170 is thermally grown on the substrate through the open. Certainly, it is also possible for those skilled in the art to utilize other techniques to form the second gate dielectric layer 170 through the open, for example, removing unwanted parts using a mask after deposition. In order to guarantee good device performance, the thickness of the second gate dielectric layer 170 is selected to be less than the thickness of the first gate dielectric layer 150. More preferable device performance can be obtained through appropriately selecting the thickness of the second gate dielectric layer 170. In one embodiment, the thickness of the second gate dielectric layer 170 may be in a range that is larger than or equal to 0.5 nm and less than 200 nm. Certainly, those skilled in the art can also select other thickness for the first gate dielectric layer 150 depending upon the expected performance and applications of the device. As shown in FIG. 6, a step is generated between the second gate dielectric layer 170 and the residual 155 of the first gate dielectric layer. Both of the second gate dielectric layer 170 and the residual 155 of the first gate dielectric layer form together the gate dielectric layer in the finished device. For example, the residual 155 of the first gate dielectric layer 150 forms a first thickness portion of the finished gate dielectric layer, and the second gate dielectric layer 170 forms a second thickness portion of the finished gate dielectric layer. The first thickness portion is thicker than the second thickness portion.

Figure 7:
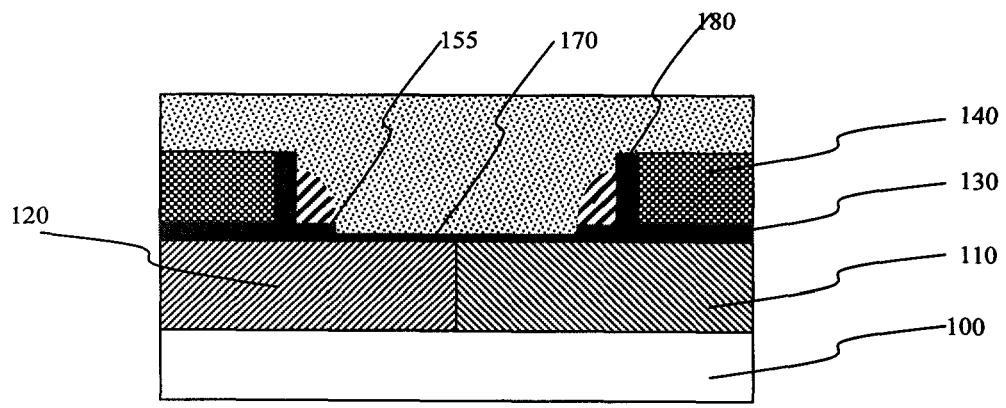
FIG. 7 is a cross section view of a semiconductor device at seventh step of its manufacture according to one embodiment of the invention.
Figure 8:
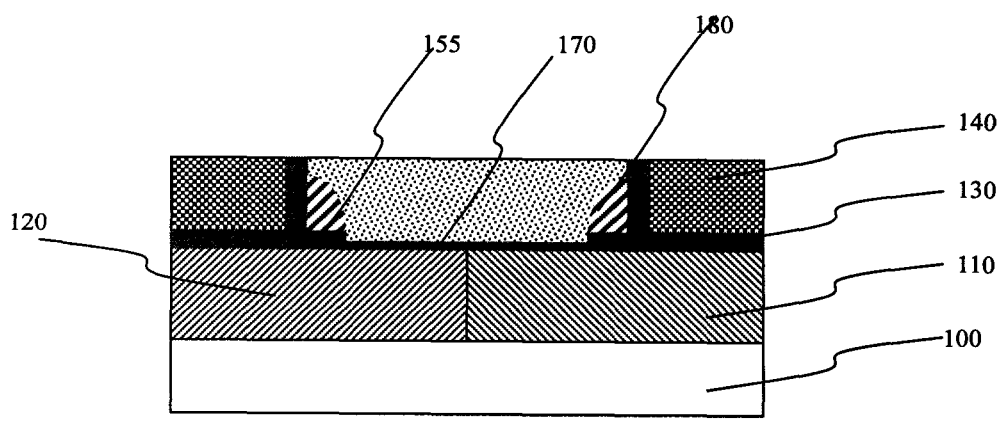
FIG. 8 is a cross section view of a semiconductor device at eighth step of its manufacture according to one embodiment of the invention.

In FIG. 7, polycrystalline silicon is deposited on the device shown in FIG. 6. In FIG. 8, excessive polycrystalline silicon is removed through chemical mechanical polishing to form a gate 300 in the open.

Figure 9:
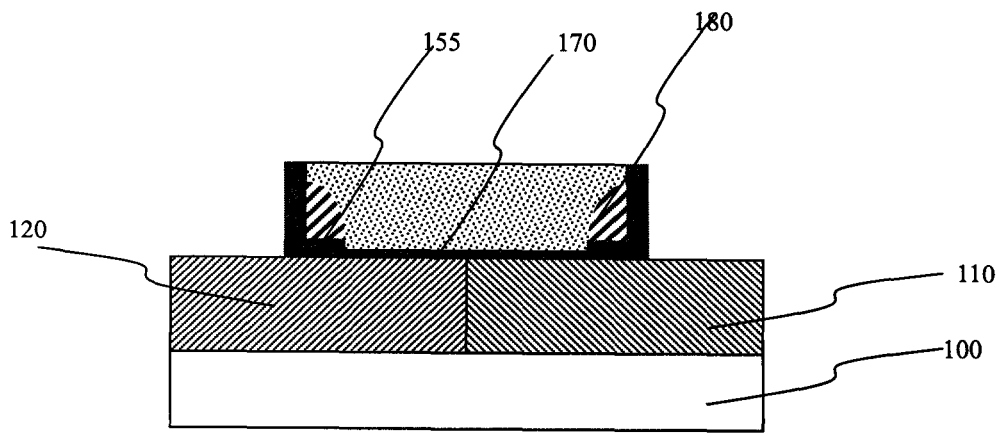
FIG. 9 is a cross section view of a semiconductor device at ninth step of its manufacture according to one embodiment of the invention.

In FIG. 9, the nitride dielectric layer 140 and the oxide dielectric layer 130 are removed through selective etching on the device of FIG. 8, so as to form the device shown in FIG. 9.

Figure 10:
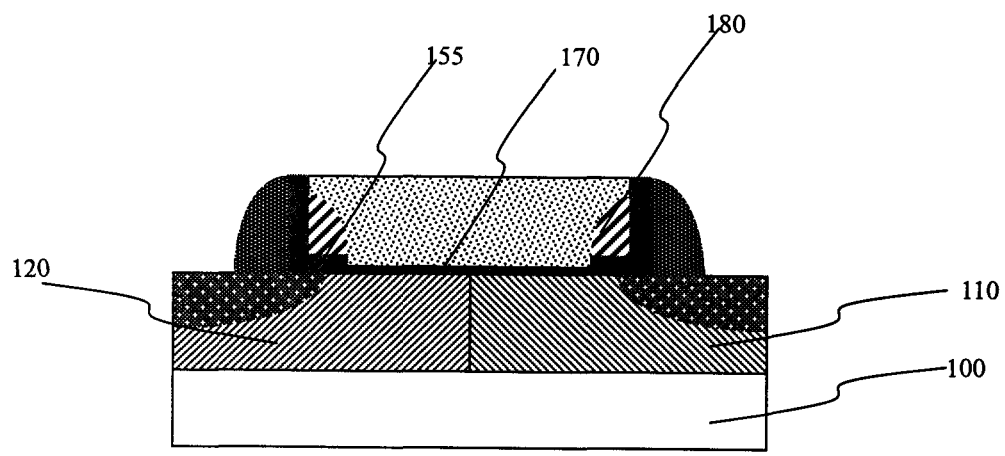
FIG. 10 is a cross section view of the finished semiconductor device according to one embodiment of this invention.
Figure 11:
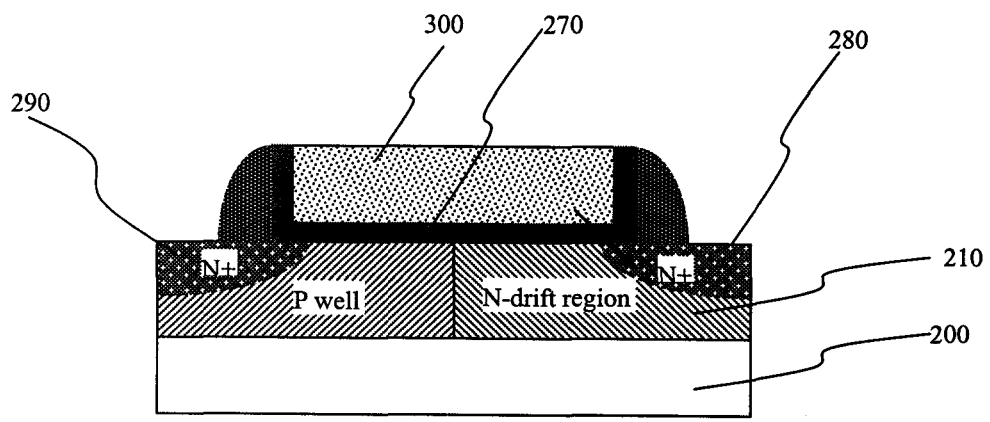
FIG. 11 is a cross section view of a semiconductor device of the prior art.

Finally, as well known by those skilled in the art, a spacer is formed on opposite sides of the gate 300, and the N well 110 and the P well 120 are doped to form source 290 and drain 280 regions to complete the manufacture of the LDMOS, as shown in FIG. 10. Note that, in the LDMOS of FIG. 10 according to the present invention, the drain region 280 is located below the residual 155 of the first gate dielectric layer and does not extend beyond the residual 155 in the direction from the drain 280 to the center of the gate 300. Thereby, the thicker residual 155 may ensure a higher breakdown voltage at the drain 280 to gate 300 region. Similarly, in another embodiment, the source region 290 is also located below the residual 155 of the first gate dielectric layer, not extending beyond the residual 155 in the direction from the source 290 to the center of the gate 300. The above structure can be realized through selecting process conditions, such as the width of the spacer, doping time, and the like. Further, since various semiconductor devices having various sizes may be designed for practical applications, when forming the residual 180 of the nitride dielectric layer and the residual 155 of the first gate dielectric layer, the size of the drain region to be formed can be considered in advance and conditions selected for etching the dielectric layer 160 accordingly.

Although a preferable embodiment according to this invention have been described with reference to drawings, however, it should be noted that the embodiment is merely given as an example for illustration, and are not intended to limit this invention in any way. Upon reading this application, various modifications and changes can be made by those skilled in the art without departing from the spirit and protection scope of this invention, which should be still treated as falling within the protection scope of this invention.

For example, as to LDMOS devices, only the overlap portion of the drain and gate regions will endure a higher voltage, so that it is preferred to ensure a thicker gate dielectric layer at that region. Therefore, in FIG. 5, the residual portion of the first gate dielectric layer 150 and the residual 180 at the overlap of the source and gate regions can be removed by a photomask. Accordingly, in FIG. 6, the overlap of the source and gate regions can be covered by the generated second gate dielectric layer 170. Such a change will not lessen the benefits of the process, and hence fall within the scope of the invention.

As mentioned above, in a semiconductor device according to the invention, portions of the gate dielectric layer on opposite sides have a first thickness, and the other portions of the gate dielectric layer have a second thickness. The second thickness is less than the first thickness. In other words, in one embodiment, the portions of the gate dielectric layer according to the invention located above the channel region is thinner than the portions located at the overlap region of the drain and gate regions.

According to the semiconductor device of the invention, the overlap portion of the gate dielectric layer with the drain region is thicker, ensuring that the device can endure a higher breakdown voltage. On the other hand, portions of the gate dielectric layer located above the channel region is thinner, thereby ensuring the device performance is not degraded.

Those skilled in the art may fully understand various terms used herein, for example, in general, lightly doping has a range of $1E13\sim1E15/cm^2$, while deeply doping has a range of $5E14\sim1E16/cm^2$. However, the above terms should not be limited to the examples which are given merely for illustration, and should be distinguished in light of relative doping concentrations therebetween.

It should be noted that although this invention is described in term of a specific conductive type (for example, N type), however, according to the type of the device, the present method can also be realized with a contrast conductive type. Words "approximately" or "about" are used herein to mean that values or positions expressed with such words are expected to be proximate to the specified values and positions. However, it is well known in the art that slight deviations present ubiquitously may prevent the precise match therebetween. It is well known in the art that a deviation up to about 10% (and for semiconductor doping concentrate, up to 20%) is considered as a reasonable deviation of the ideal target.

Further, although some oxide or nitride layers are shown as single layers in this specification and drawings, those skilled in the art will appreciate that single or multiple oxide or nitride dielectric layers can be selected based on specific applications, at this time, the process can be changed consequently according to the components of the selected dielectric layer(s).

What is claimed is:

1. A method of manufacturing a semiconductor device, comprising the following steps:
   providing a semiconductor substrate, forming a patterned dielectric layer on the substrate, the patterned dielectric layer having an opening therein exposing a portion of an upper surface of the substrate;
   forming a first gate dielectric layer and a mask layer of dielectric material on the first gate dielectric layer, said first gate dielectric layer and said mask layer conforming with the patterned dielectric layer and the opening on the substrate;

etching the mask layer to retain at least a portion of the mask layer on the first gate dielectric layer within the opening so that a residual of the mask layer is located within the opening and is attached to the first gate dielectric layer at a sidewall of the opening;

etching the first gate dielectric layer using the residual of the mask layer of dielectric material to expose a portion of the substrate within the opening; and forming a second gate dielectric layer on the exposed substrate portion, wherein the thickness of the second gate dielectric layer is less than that of the first gate dielectric layer.

2. The method according to claim 1, wherein the step of forming the second gate dielectric layer within the opening is further followed by:

forming a gate on the substrate;

forming a lightly doped drift region of a first conductive type and a well of a second conductive type on opposite sides of the gate, and forming a heavily doped drain region of the first conductive type in the drift region, and forming a source region in the second conductive type well.

3. The method according to claim 1, wherein the step of removing the mask layer further comprises:

removing the mask layer through dry etching.

4. The method according to claim 1, wherein the step of forming the second gate dielectric layer within the opening comprises thermally growing the second gate dielectric layer in the opening, the second gate dielectric layer having a range of thickness greater than or equal to 0.5 nm and less than 200 nm.

5. The method according to claim 1, wherein forming the first gate dielectric layer and the mask layer within the opening comprises depositing the first gate dielectric layer, the first gate dielectric layer having a range of thickness greater than or equal to 1 nm and less than or equal to 200 nm.

6. The method according to claim 1, wherein the step of forming an opening on the substrate using the patterned dielectric layer comprises:

forming the dielectric layer on the substrate, which includes a nitride dielectric layer and an oxide dielectric layer; and etching the dielectric layer to form the opening on the substrate and expose a portion of the substrate.

7. The method according to claim 2, further comprising:

depositing polycrystalline silicon to fill the opening;

removing a portion of the polycrystalline silicon through chemical mechanical polishing to retain the polycrystalline silicon portion located within the opening so as to form the gate;

removing the patterned dielectric layer;

forming gate spacers on opposite sides of the gate; and forming the source and drain regions on opposite sides of the gate.

8. The method according to claim 1, wherein the second gate dielectric layer is located on the exposed portion of the substrate between a source region and a drain region.

9. The method according to claim 8, wherein the drain region does not extend in a direction from the drain region to the center of the gate beyond the residual of the mask layer and the source region does not extend in a direction from the source region to the center of the gate beyond the residual of the mask layer.

* * * * *